(12) United States Patent
Johnson et al.

(10) Patent No.: US 6,414,870 B1
(45) Date of Patent: Jul. 2, 2002

(54) MAGNETOQUENCHED SUPERCONDUCTOR VALVE WITH BILAYER FERROMAGNETIC FILM FOR UNIAXIAL SWITCHING

(75) Inventors: Mark B. Johnson, Springfield, VA (US); Thomas W. Clinton, Bethesda, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/690,838

(22) Filed: Oct. 18, 2000

(51) Int. Cl.$^7$ ................................................ G11C 11/44
(52) U.S. Cl. ...................................... 365/160; 365/174
(58) Field of Search ................................ 365/160, 170, 365/174, 145, 208, 223, 225.5, 157

(56) References Cited

U.S. PATENT DOCUMENTS

| | | | | |
|---|---|---|---|---|
| 5,011,817 A | * | 4/1991 | Hidada et al. | 505/1 |
| 5,039,656 A | * | 8/1991 | Hidaka | 505/1 |
| 5,388,068 A | | 2/1995 | Ghoshal et al. | 365/162 |
| 5,608,282 A | | 3/1997 | Wilbur et al. | 505/211 |
| 5,629,549 A | * | 5/1997 | Johnson | 257/421 |
| 5,841,342 A | | 11/1998 | Hegmann et al. | 338/325 |
| 5,930,165 A | | 7/1999 | Johnson et al. | 365/171 |

OTHER PUBLICATIONS

Clinton, et al., Nonvolatile switching Josephson Junctions, Journal of Applied Physics, vol. 85, No. 3, pp 1637–1643, Feb., 1999.

Clinton, et al., Magnetoquenched Superconducting Valve with Bilayer Ferromagnetic Film for Uniaxial Switching, Applied Physics Letter, vol. 76, No. 15, pp 2116–2118, Apr., 2000.

* cited by examiner

Primary Examiner—David Nelms
Assistant Examiner—Thong Le
(74) Attorney, Agent, or Firm—John J. Karasek; Philip E. Ketner

(57) ABSTRACT

A magnetoquenched superconductor device or cell includes a superconductor element disposed on a substrate and a bilayer ferromagnetic film which provides uniaxial switching. The bilayer film is formed by a first ferromagnetic film disposed on and isolated from the superconductor element; and a second ferromagnetic film disposed on and separated from the first ferromagnetic film. The first and second films are magnetically coupled and have magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor. A number of two dimensional memory arrays are provided which use rows and columns of the devices. Switching of the devices is controlled by respective write (read/write) lines or bias lines.

18 Claims, 5 Drawing Sheets

MAGNETOQUENCHED SUPERCONDUCTOR VALVE WITH BILAYER FERROMAGNETIC FILM FOR UNIAXIAL SWITCHING

BACKGROUND OF THE INVENTION

1. Field of the Invention

The present invention relates to a microquenched superconductor valve device and, more particularly, to an improved valve device having a bilayer ferromagnetic film.

2. Description of the Related Art

A magnetoquenched superconducting valve is a superconductor switching device with applications in digital and analog superconducting electronics. As explained in more detail below, locally strong fringe fields from a ferromagnetic film microfabricated on top of a superconducting strip create a weak link in the superconductor and suppress the critical current ($I_c$). The magnitude of the magnetic fringe field is controlled by manipulating the orientation of the ferromagnetic film and in this way the weak link can be created or removed, i.e., the device can be turned "on" and "off." The intrinsic remanence of the magnetization provides a natural memory function, and the device can be used as a nonvolatile storage cell. Current pulses in contiguous write wires can be used to control the magnetization orientation of the ferromagnetic and thereby control the switching state of the device. The magnitude of the control current can be made smaller than the critical current of the superconductor and thus the device can have current gain and can be used as a current amplifier.

The basic operation and the fundamental capabilities of the magnetoquenched semiconductor valve are described, for example, in U.S. Pat. No. 5,930,165 (Johnson et al), which is hereby incorporated by reference. However, to briefly summarize this description, reference will be made to FIG. 1 which shows an exploded perspective view of such a valve device, which is generally denoted 10. A superconducting bridge 10 is fabricated on a substrate 11 so as to extend parallel to the y axis and has a width $W_s$ and critical current $I_c(t)$, where t is the reduced temperature $T/T_c$ and $T_c$ is the critical temperature. A supply current is indicated by arrow 13. A thin ferromagnetic film 14 is fabricated on top of semiconductor 12 and is isolated therefrom by a very thin insulating layer 16, such as a tunnel barrier. Orthogonal write wires 17 and 19 provide first and second control currents indicated by arrows 18 and 20 and are formed by a conductor 22 and corresponding insulator 24. Ferromagnetic film 14 has two anisotropy axes such that the magnetization $\vec{M}$ is stable along either the x or y axis.

The device of FIG. 1 works in the following way. When the magnetization is oriented along the x axis, dipolar fringe fields originating from the ends of film 14 are substantially parallel to the plane of superconductor 12 and have a weak magnitude in the vicinity thereof. Thus there is little or no effect on the superconducting properties of superconductor 12. This is called the unquenched state of superconductor 12, equivalently the "off" state of the device. However, when the magnetization of film 14 is oriented along the y axis, the dipolar magnetic fringe fields $\vec{B}$ that originate at the edge of film 14 have a large magnitude in the vicinity of superconductor 12. In particular, there is a large component $B_z$ perpendicular to the plane of superconductor 12. Much of the fringe field is shielded by Meissner currents in the superconductor 12, and most of the field is deflected to the side of the superconductor. However, the component $B_z$ is sufficiently large that it exceeds the critical field in a small, local region directly beneath the edge of film 14 and a "weak link" of normal metal is thereby created. The weak link causes substantial suppression of the critical current $I_c(t)$ of the superconducting bridge 12. This is called the quenched state of the superconductor 12, equivalently the "on" state of the switch.

The operation of the switch 10 relies on the remanent magnetization $M_r$ of the ferromagnetic film 14, and therefore is intrinsically both "latching" and "nonvolatile." Energy is only used to set or reset the magnetization state of ferromagnetic film 14, and the quiescent power is zero. An upper bound of the switching speed of the device is the order of 1 nsec, and it may switch as rapidly as 1 psec. Integrated device operation invokes the application of current pulses to integrated write wires 17 and 19 shown in FIG. 1. A current pulse of appropriate amplitude and duration applied to the write wire 19 oriented parallel to the y axis orients the magnetization along the x axis, and the device is put into the unquenched or "off" state. A current pulse of appropriate amplitude and duration applied to the write wire 17 oriented parallel to the x axis orients the magnetization along the y axis, and the device is put into the quenched or "on" state.

SUMMARY OF THE INVENTION

According to the invention, a magnetoquenched superconducting valve device is provided which provides important advantages over the basic valve device described above. Generally speaking, whereas the basic device uses a single ferromagnetic film or layer (corresponding to layer 14 of FIG. 1) and two magnetic anisotropy axes to provide fringe fields, the valve device of the invention uses a bilayer of ferromagnetic films as the ferromagnetic element that provides the fringe magnetic field. With this construction, a single magnetic anisotropy axis can be employed and this provides several associated advantages. More particularly, the areal dimensions of the device all can be reduced or shrunk, thereby permitting greater packing densities. Further, a single write wire can be used to control the magnetization orientation, thereby resulting in a simpler cell architecture.

An object of the invention is to provide an improved magnetoquenched superconductor valve device characterized by a single magnetic anisotropy axis. As indicated above, such a device needs only a single integrated write wire to control the device state. In contrast, the original or basic device requires two perpendicular write wires to control the device state. The write wire of the modified device of the invention can be fabricated from a superconducting material, thereby affording low power operation.

A further object of the invention is to provide an improved valve device with a single magnetic anisotropy axis which can be used as an integrated memory cell and which can be fabricated in a two dimensional array of cells, using a standard half-select process for addressing individual cells.

Yet another object of the invention is to provide an improved valve device with a single magnetic anisotropy axis which can be fabricated with smaller dimensions, and which can, therefore, be integrated with higher packing densities.

A further object of the invention is to provide an improved valve device that includes a superconducting ground plane which acts to increase the write fields (thereby decreasing the write current for a given, required write field), and to decrease the effects of the self-fields of the superconducting current in the bridge.

An additional object of the invention is to provide a modified ferromagnetic element comprising two ferromagnetic layers that can be incorporated in Hybrid Hall Effect (HHE) memory cells, such that each of the two ferromagnetic layers in the element stores a single bit of information. In this way, each HHE cell can store two bits of data. This object can, in principle, be generalized to n ferromagnetic layers storing n bits of information per cell.

In accordance with the invention, a magnetoquenched superconductor is provided which comprises: a substrate; a superconductor element disposed on the substrate; a first ferromagnetic film disposed on the superconductor element; and a second ferromagnetic film disposed on the first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor.

Preferably, the device further comprises an insulating layer on the superconductor element for isolating the first ferromagnetic layer from the superconductor element. Advantageously, the device further comprises a separator layer disposed between the first and second ferromagnetic films. In one preferred embodiment, the separator layer comprises an insulator. In an alternative preferred embodiment, the separator layer comprises a nonmagnetic metal.

Preferably, the ferromagnetic films have different coercivities. Alternatively, or in addition, the ferromagnetic films have different magnetic moments.

In a presently preferred implementation, the ferromagnetic films have both different anisotropies and coercivities.

In one particular advantageous embodiment, one of the ferromagnetic films has a coercivity that is substantially higher than that of the other film and has a fixed orientation, and the other film has an orientation which is controlled.

Preferably, the superconductor element comprises a superconductor bridge and the device further comprises a superconductor ground plane.

In accordance with a further aspect of the invention, a random access memory circuit is provided which comprises: a plurality of magnetoquenched superconductor devices arranged in an array of rows and columns, a row of write lines each individually associated with a corresponding row of superconductor devices, and a column of write lines each individually associated with a corresponding column of super conductor devices; said superconductor devices each comprising: a substrate; a superconductor element disposed on said substrate; a first ferromagnetic film disposed on said superconductor element; and a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and said write lines controlling switching of individual ones of said superconductor devices.

In accordance with another aspect of the invention, a memory circuit is provided which enables nondestructive readout of data stored therein, the memory circuit comprising: a plurality of magnetoquenched superconductor devices arranged in an array of columns and rows; a row of bias lines each individually associated with a corresponding row of superconductor devices; a row of readout lines each individually associated with a corresponding column of superconductor devices; a plurality of sense amplifiers each connected to one of said readout lines; first means connected to each of said bias lines and to each of said superconductor devices for establishing a bias threshold for each of said superconductor devices; and second means connected to each of said sense lines and to each of said superconductor devices for isolating the respective superconductor devices from the corresponding sense line; said superconductor devices each comprising: a substrate; a superconductor element disposed on the substrate; a first ferromagnetic film disposed on the superconductor element; and a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and said bias lines controlling switching of the magnetizations of said superconductor devices and said sense lines sensing switching of the magnetization of said superconductor devices.

Preferably, the first and second means comprise first and second diodes, respectively, each of said first diodes being connected between an associated bias line and a corresponding superconductor device and each of said second diodes being connected between an associated sense line and a corresponding superconductor device.

In accordance with still another aspect of the invention, a random access memory circuit is provided which enables nondestructive readout of data stored therein, said circuit comprising: a plurality of magnetoquenched superconductor devices arranged in a two dimensional array of rows and columns; a plurality of columns of read/write lines each individually associated with a corresponding column of superconductor devices; a plurality of rows of read/write lines each individually associated with a corresponding row of superconductor devices; a sense line connecting all of said superconductor devices in series for receiving a bias current and for enabling readout of the presence of a voltage or lack thereof, said superconductor devices each comprising: a substrate; a superconductor element disposed on said substrate; a first ferromagnetic film disposed on said superconductor element; and a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and the read/write lines controlling switching of the magnetizations of said devices and the presence or absence of a said voltage being a function of whether a said weak link has been formed.

In accordance with yet another aspect of the invention, a hybrid Hall effect memory cell is provided, the cell comprising: a Hall plate; a first ferromagnetic layer disposed on said Hall plate; a first separating layer for electrically isolating the first ferromagnetic layer from said Hall plate; at least a second ferromagnetic layer disposed on first ferromagnetic layer; and a second separating layer electrically isolating said first and second ferromagnetic layers, each of said first and second ferromagnetic layers storing a single bit of data such that said memory cell stores at least two bits of data.

Further objects, features and advantages of the present invention will be set forth in, or apparent from, the detailed description of preferred embodiments thereof which follows.

DESCRIPTION OF THE PREFERRED EMBODIMENTS

Figure 1:
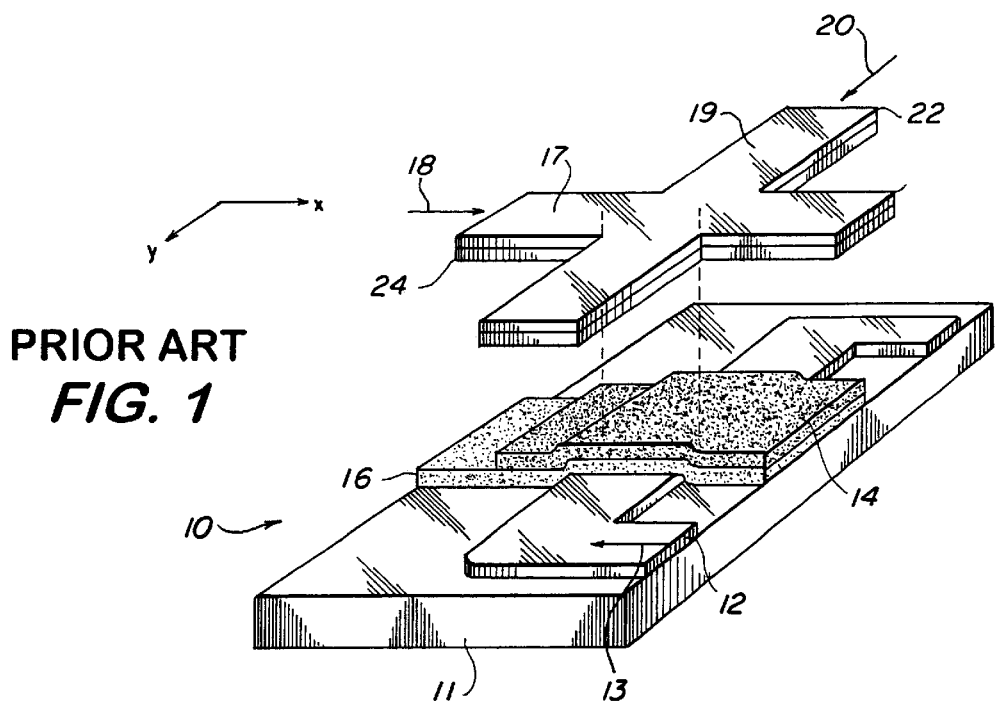
FIG. 1, which was described above, is a perspective view of a prior art magnetoquenched superconductor valve.
Figure 2A:
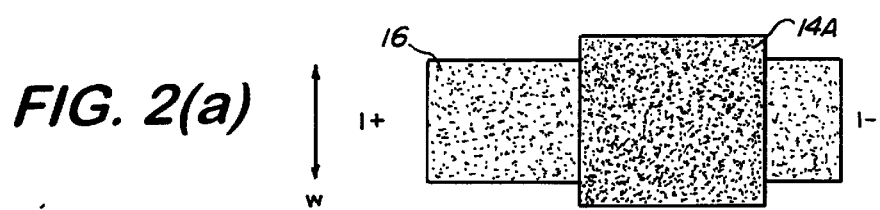
FIGS. 2(a), 2(b) and 2(c) are a top plan view, a side elevational view and a side elevational view, respectively, of a magnetoquenched superconductor valve in accordance with the present invention.
Figure 2B:
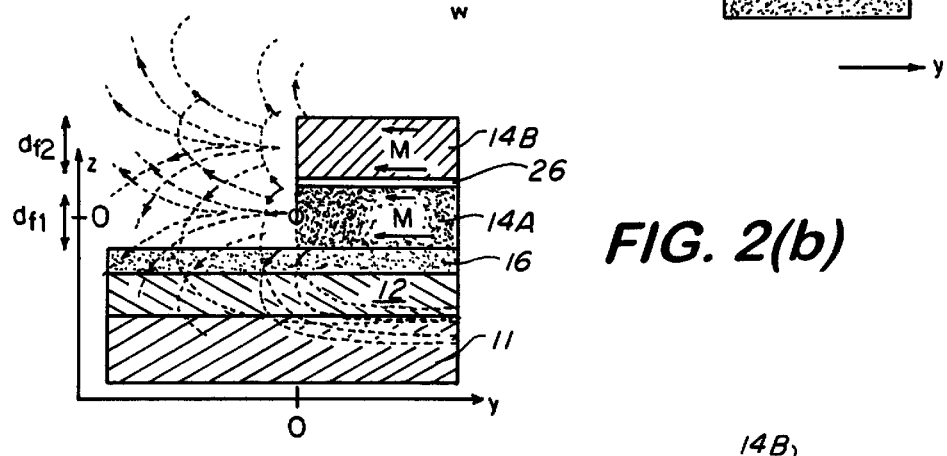
Figure 2C:
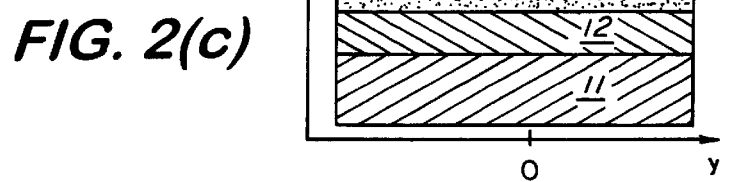

Referring to FIGS. 2(a) to 2(c), a first preferred embodiment of the invention is shown which schematically represents the general case. As indicated above, the present invention is an improvement over the device of FIG. 1, and like elements have been given the same reference numerals with the exceptions noted below.

In the device of FIGS. 2(a) to 2(c), the ferromagnetic film layer corresponding to film layer 14 of FIGS. 1(a) to 1(c) is a bilayer composed of two ferromagnetic films 14A and 14B. As in the device of FIG. 1, the lower film 14B is fabricated on a superconductor 12 while being isolating therefrom by an insulating layer 16, while superconductor 12 itself is fabricated on a substrate 11. Films 14A and 14B are separated by a thin layer 26 which can be either a nonmagnetic metal or an insulator, and films 14A and 14B are magnetically coupled, for example by magnetostatic coupling or by exchange coupling. In an important implementation, the films 14A and 14B are fabricated such that the films have different coercivities and different magnetic moments. Films 14A and 14B can be composed of different materials, e.g., different transition metal ferromagnets, or composed of the same material but fabricated under conditions that result in different anisotropies and coercivities for the two films.

The operation of the modified device of FIGS. 2(a) and 2(b) can be better understood by referring to the two device states depicted in FIGS. 2(b) and 2(c). In FIG. 2(b), the magnetizations of both film 14A and 14B are parallel, e.g., extend in parallel relation along the -y axis. Both films produce magnetic fringe fields of the same sign, and the perpendicular component $B_z$ is the sum of component contributions from films 14A and 14B. A weak link is formed in the quenched state of FIG. 2(b), in the manner described above, and the switch is "on." In FIG. 2(c), the magnetizations of films 14A and 14B are antiparallel. In this case, one of the ferromagnetic films 14B acts to absorb the fringe field (i.e., magnetic flux) of the other film 14A, and the magnitude of fringe field in the vicinity of the superconductor is negligible. This is an unquenched state, and the switch is "off." A key feature of the geometry of the modified valve device of the invention is that the magnetization of the ferromagnetic layers 14A, 14B is always along the x axis, and thus a device with two magnetic anisotropy axes (i.e., the device of FIG. 1) is reproduced by a device with a single anisotropy axis.

Figure 3A:
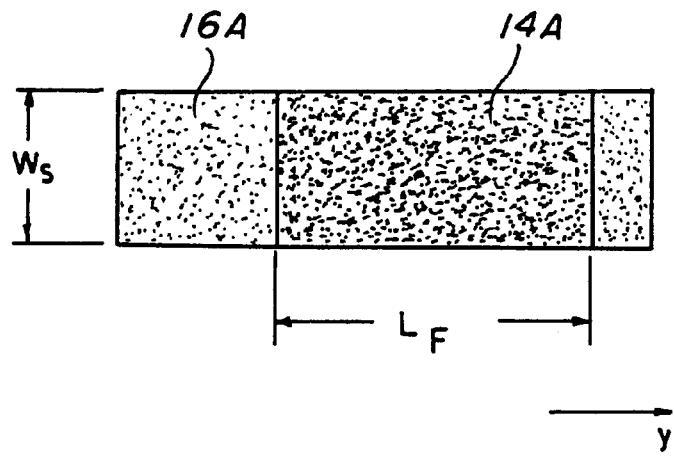
FIGS. 3(a) and 3(b) are a top plan view and a side elevational view, respectively, of a presently preferred embodiment of the valve of FIGS. 2(a) to 2(c)
Figure 3B:
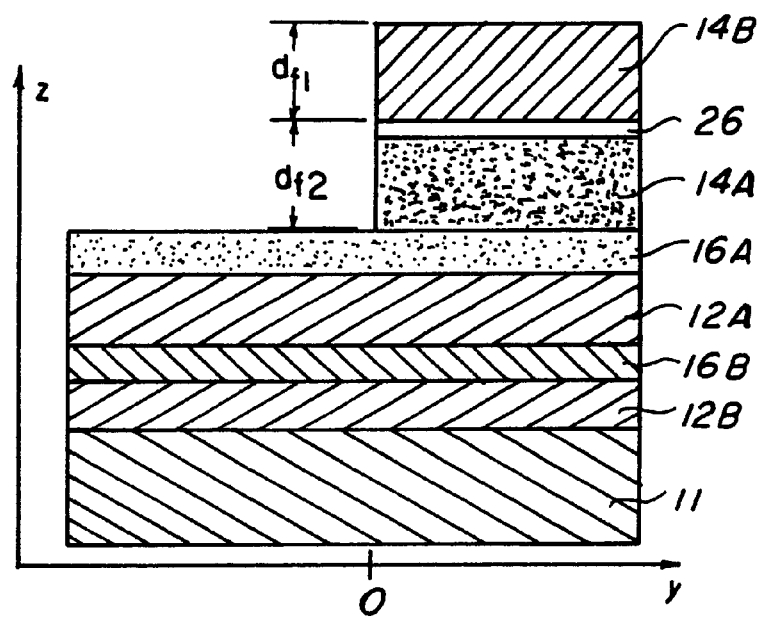

Referring to FIGS. 3(a) and 3(b), a presently preferred embodiment of the device structure is shown. It will be appreciated that the dimensions that are discussed herein represent typical dimensions used in prototype devices, and are relevant for commercial application, but the invention is not limited to these dimensions. A goal of superconducting electronics is to achieve increased packing density and decreased device size, and it will also be understood that smaller device dimensions are entirely possible. As shown in FIG. 3(b), this embodiment is similar to the generalized embodiment of FIGS. 2(a) to 2(c) but includes a superconductor bridge 12A and a superconductor ground plane 12B and corresponding insulating layers 16A and 16B. Referring to FIG. 3(a), which is similar to FIG. 2(a), the superconducting bridge 12A typically has a width $W_s$=1 $\mu$m to 5 $\mu$m, and is composed of a low temperature superconductor (LTS) such as Pb, Nb or NbN or is composed of a high temperature superconductor (HTS) such as YBCO or BSCCO. The ferromagnetic films 14A and 14B can be fabricated with the same width $W_s$, or can slightly overlap the edges of the bridge 12A. It is helpful to use several magnetic anisotropies in the fabrication of films 14A, 14B. A shape anisotropy is useful and may be necessary in some constructions. The dimensions of the films 14A, 14B can be chosen so that the ratio of length $L_F$ to width $W_s$ is typically $L_F/W_s$=5.

Both film 14A and film 14B can be composed of elemental transition metal ferromagnets such as Fe, Co, or compounds such as Permalloy $Ni_{0.8}Fe_{0.2}$ or iron cobalt $Fe_{0.1}Co_{0.9}$. In one typical mode of operation, one of the ferromagnetic layers has a large coercivity and its orientation never changes, while the other ferromagnetic element has a low coercivity such that its orientation is controlled by relatively small write current amplitudes. With this in mind, a typical device structure corresponding to that shown in FIG. 3(b) can be fabricated in a way similar to the basic device of FIG. 1. The superconducting bridge 12A has a typical thickness of 10–100 nm. For the modified device of the invention, the ferromagnetic element formed by film layers 14A, 14B would preferably be fabricated with bottom film 14A composed of a material with a large moment and large coercivity, such as Co or FeCo, with a thickness 100 nm. The thin nonmagnetic layer 26 is then deposited as a spacer and can be composed of, for example, a nonmagnetic metal like Au, Cu or Al with thickness 10 nm or a nonmagnetic insulator such as $SiO_2$ or $Al_2O_3$ with thickness 2 nm. At these values of thickness of layer 26, the magnetic coupling between films 14A and 14B is magnetostatic and is relatively weak. The principle of the invention can also be achieved using a stronger exchange coupling, in which case the layer thickness of layer 26 would be carefully tuned to the particular system, and would be typically thinner. The top ferromagnetic layer 14B is preferably composed of a material with relatively low moment and low coercivity such as Permalloy $Ni_{0.8}Fe_{0.2}$, with a thickness of 100 nm. The ferromagnetic element formed by films 14A, 14B may be coated with a thin nonmagnetic metal or insulator to passivate the surface, but this step is not necessary.

Figure 4:
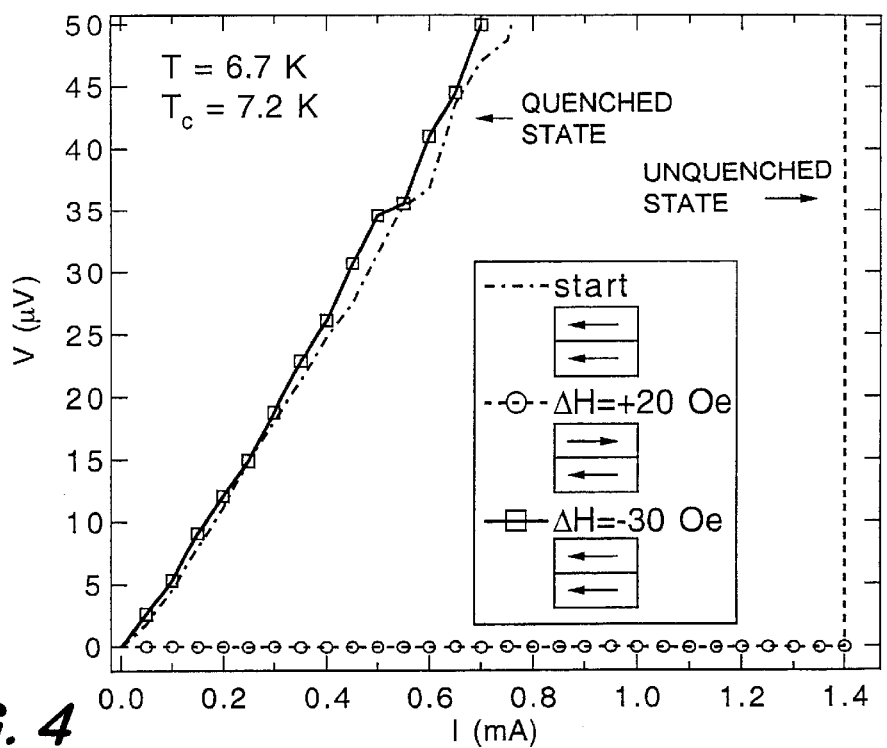
FIG. 4 is a graph used in explanation of the operation of the valve of the invention.

Although it is to be understood that this example is not intended to be limiting, a prototype device corresponding to that shown in FIG. 3($b$) has been made having the following specifications. The bottom layer 14A was Co with a thickness 150 nm, and had a coercivity of about $H_{c1} \approx 40$ Oe. The nonmagnetic spacer 26 was Al with a thickness 10 nm. The top layer 14B was Permalloy with a thickness 150 nm, and had a coercivity of about $H_{c2} \approx 4$ Oe. This device has been tested and typical data are shown in FIG. 4. In the corresponding experiment, the external field H is varied along the single axis y to achieve the configurations depicted in the upper figure in the inset in FIG. 4. At first, H is set to a negative value and then the external field is removed, H=0. With the magnetizations $M_1$ and $M_2$ parallel along the -y axis, the device is in the quenched state and, at this temperature, the critical current is zero. After setting the field to H=20 Oe and returning to H=0, the stable antiparallel configuration (shown in the middle figure of the inset in FIG. 4) is an unquenched state with a relatively large critical current, $I_c=1.4$ mA. Finally, setting the field to H=–30 and returning to H=0 recovers the initial state of magnetization orientations, and the device is again in the stable quenched state with zero critical current.

As indicated above, one very important advantage of the modified valve device of the present invention is that the device can be switched from "on" to "off" by manipulating the magnetization orientation along a single magnetic anisotropy axis. Device integration is thereby facilitated, and it follows that the particular application of providing nonvolatile storage is readily enabled.

Considering the storage application in more detail, it is noted that the basic device and the modified device of the invention are intrinsically nonvolatile storage cells with the "on" and "off" states corresponding, for example, to a binary "1" and "0." The magnetic characteristics of the device can be described by a M(H) hysteresis loop. If that loop is sufficiently square, so-called "half-select" write processes can be performed and a two-dimensional random access memory can be readily fabricated. In this regard, the "write" process involves applying a current pulse of appropriate amplitude and duration to an integrated write wire. The current pulse is inductively coupled to the ferromagnetic film such that fringe magnetic fields from the current pulse are parallel to the plane of the film and have sufficient amplitude to orient the magnetization $\vec{M}$. For a given geometry with a particular inductive coupling strength, the amplitude of the write pulse $I_w$ is chosen to be slightly larger than the switching field of the ferromagnetic.

Figure 5:
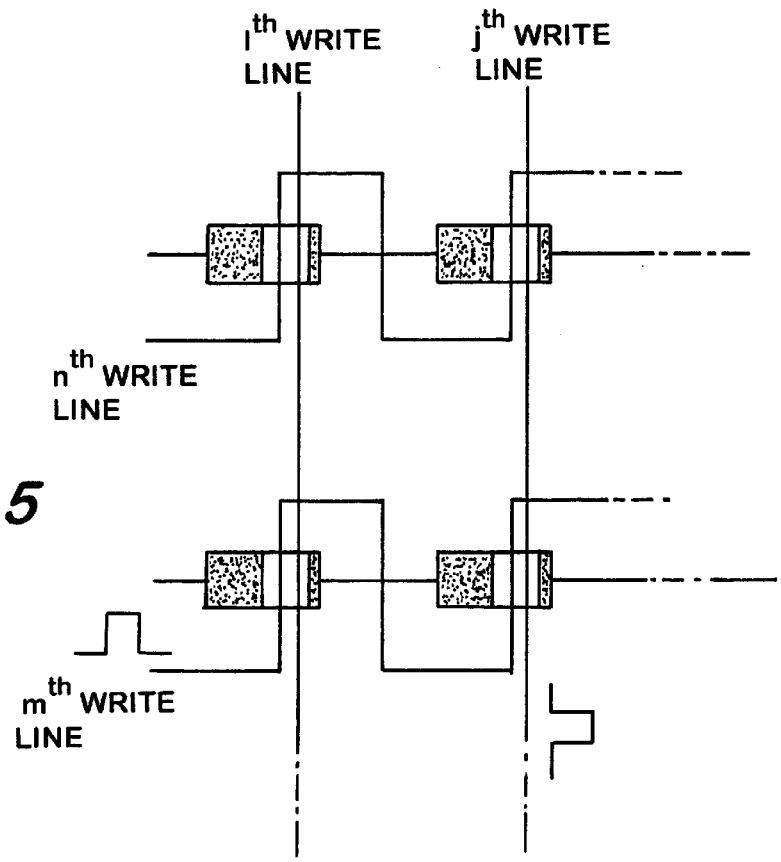
FIG. 5 is a schematic circuit diagram of a random access memory array incorporating the valve devices or cells of the invention and constructed in accordance with a first preferred embodiment of the invention.

Referring to FIG. 5, a simple two dimensional RAM architecture is shown which uses a "half-select" process along with a two dimensional array of write wires. In the example illustrated, four magnetoquenched superconductor devices 30A, 30B, 30C and 30D are shown, together with the $n^{th}$ and $m^{th}$ write lines 32A and 32B and the $j^{th}$ and $i^{th}$ write lines 32C and 32D. It will, of course, be appreciated that a very large number of devices, and thus write lines, would typically be provided to form a memory of a practical size and the simplified architecture of FIG. 5 is representative of such an architecture. The write process proceeds as follows. The amplitude of write current pulse in, e.g., the $m^{th}$ row (line 30B) and the $j^{th}$ column (line 32D) is chosen to be $I_w/2$. In this way, sending current pulses of this amplitude and same polarity, positive or negative, uniquely sets the orientation state of the magnetization of the ferromagnetic film of the corresponding cell (m,j), i.e., device or cell 30D, to be left or right, positive or negative, "0" or "1." No other cell is affected, because the stray field from a single current pulse with amplitude $I_w/2$ is insufficient to orient or reorient the magnetization $\vec{M}$. Destructive readout of the array can be performed as follows. Each row of elements is connected in series, and a single row can be read at one time. For cell (m,j), i.e., device or cell 30D, the voltage across the row is measured as a positive (or negative) probe pulse of amplitude $I_w/2$ is applied to write wires 32B (m) and 32D (j). If the voltage detected across row m changes, this will indicate that the orientation of the magnetization of cell (m,j) (device or cell 30D) was to the right (or left, if a negative probe pulse is used). If the voltage does not change, the orientation was to the left (right). Since this is destructive readout, a logic circuit must be provided that will rewrite the state of the bit after the bit has been sensed.

Figure 6:
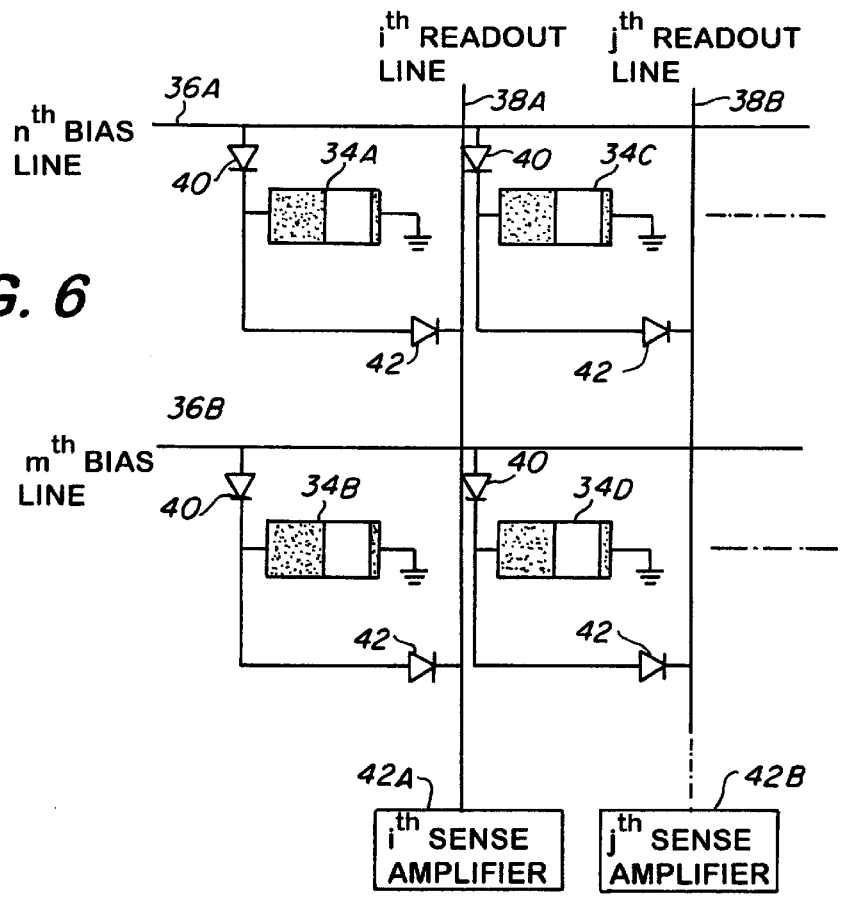
FIG. 6 is a schematic circuit diagram of a further memory array, providing nondestructive readout, in accordance with a further preferred embodiment of the invention.

Referring to FIG. 6, a memory circuit or array providing for nondestructive readout is shown. The illustrated portion of the circuit comprises four cells or devices 34A, 34B, 34C and 34D, two bias lines 36A and 36B connected to respective sense amplifiers 42A and 42B, and two groups of four diodes 40 and 42, respectively, connected as shown. To read out the contents of cell (m,j), i.e., device 34D, a bias current voltage is applied to row m (line 36B), with the bias voltage greater than an appropriate threshold in the forward characteristic of the first diodes 40 near the bias line 36B, and each cell is isolated from the associated sense line by a second diode 42 (or other appropriate element) with a characteristic internal resistance. If cell (m,j), i.e., device 34D, is in the unquenched state, the bias current is shorted through the cell 34D to ground and zero voltage (or current) is delivered to read line j (38B). If the cell 34D is in the quenched state, a finite voltage is developed and, with appropriate choice of circuit parameters, a positive voltage (or current) is delivered to read line j (38B). With an appropriate choice of parameters, this voltage is blocked from transmission to the bias line by the reverse characteristic of the diode 40 near the bias line. Further, the array can be engineered such that the same lines used for writing can also be used for the readout operation.

Figure 7:
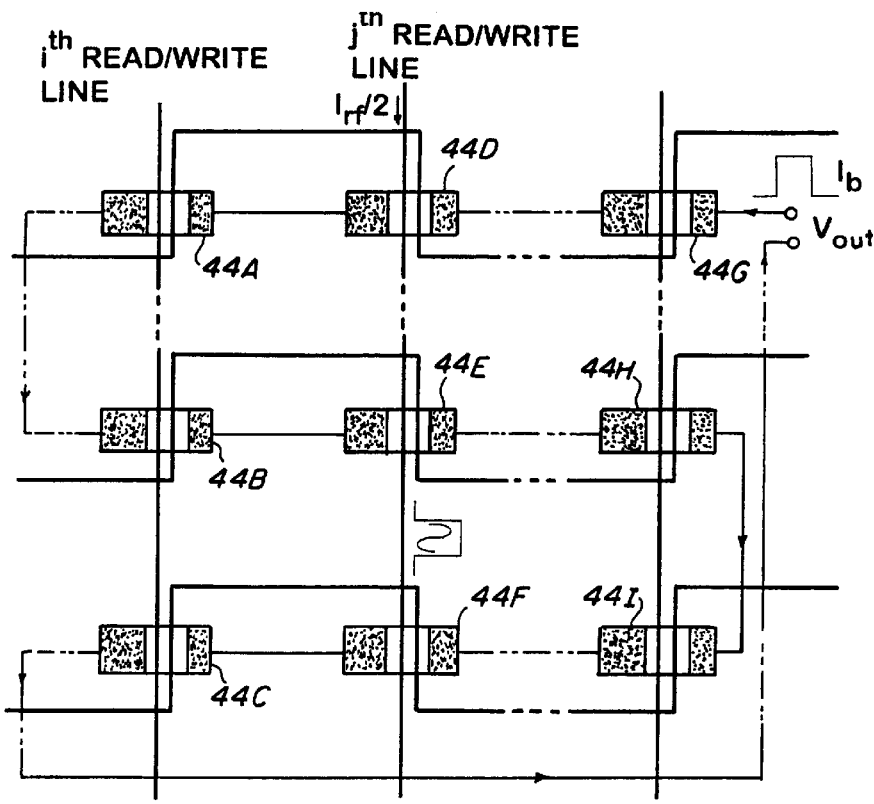
FIG. 7 is a schematic circuit diagram of a further memory array, providing nondestructive readout, in accordance with yet another embodiment of the invention.
Figure 8:
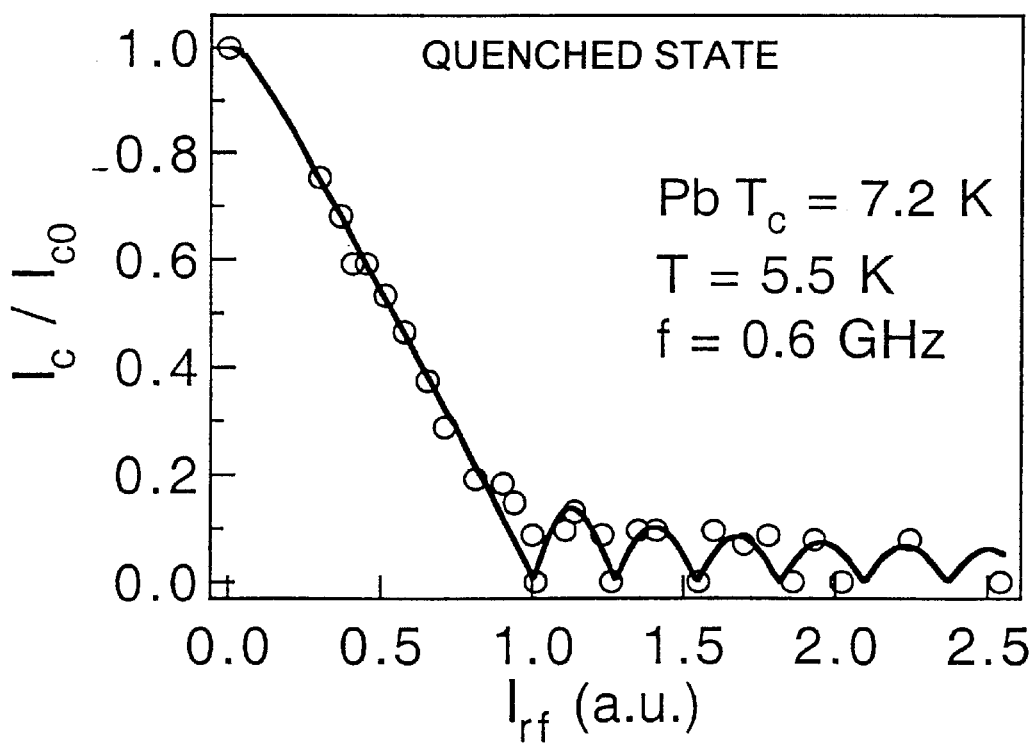
FIG. 8 is a graph used in explanation of the operation of the embodiment of FIG. 7.

Referring to FIG. 7, a further nondestructive readout circuit or array is shown which uses the two dimensional RAM architecture of FIG. 5 to provide a half select readout process. In the exemplary embodiment illustrated, nine cells or devices 44A, 44B, 44C, 44D, 44E, 44F, 44G, 44H and 44I are provided, along with associated read/write lines. The process carried out by the circuit of FIG. 7 takes advantage of the Josephson nature of the quenched state along with the AC Josephson effect, where the quenched state critical current $I_{c,q}$ is readily suppressed by exposure to microwave frequency (rf) radiation. Microwaves generated by a source of power, $P_{rf}=I_{rf}^2 R_L$, delivered to a stripline in close proximity to the junction (the write lines of FIG. 5) will induce rf currents in the junction and consequently $I_{c,q}$ is suppressed. The graph in FIG. 8 is an example of the quenched state response to rf fields wherein the normalized $I_{c,q}$ is plotted vs. $I_{rf}$. However, microwaves of a similar power range (or range of $I_{rf}$) do not substantially effect the critical current in the unquenched state, $I_{c,u}(I_{rf}) \approx I_{c,u}(0)$. To read out the contents of cell (m,j), i.e., device or cell 44e, an rf current $I_{rf}/2$ is delivered along the read (write) lines to each cell in the $m^{th}$ row and $j^{th}$ column so that only cell (m,j) (44e) has the current $I_{rf}$ delivered thereto. A specified bias current is delivered to a sense line that connects all superconducting strips in series and a voltage, or lack thereof, can be read out across this line. The rf current and the bias current are set as follows: referring to the graph of FIG. 8, $I_{rf}$ is, ideally, set to a value very near, or just less than, the value of $I_{rf}$ where the first minimum of $I_b$ is set such that $I_{c,q}(I_{rf})<I_b<I_{c,q}(I_{rf}/2)[<I_{c,u}(I_{rf})]$. If cell (m,j) is in the quenched state, then a voltage $V_{out}=V_b$ will be sensed. If cell (m,j) is in the unquenched state then there will be no voltage drop across the sense line. In the quenched state, and for a Josephson junction in general, when the device is exposed to rf radiation and for $I_b>I_{c,q}(I_{rf})$, there is a stepwise voltage across the junction with step height, known as a Shapiro step, given by $\Delta V=(2.1\times10^{-15}V/Hz)f(Hz)$. Thus in general, $V_b(I_b) \approx n\Delta V = n(2.1\times10^{-15}V/Hz)f(Hz)$ (n=1,2, . . . ), and the output of the sense line $V_b$ will depend (increasingly) on f. For example, if nanosecond read times are desired then one would set $f \geq 10^9 Hz$ (and this may not be a necessary constraint) and send synchronous signals along the read and sense lines. With the proper choice of load impedance, $R_L$, the necessary rf current amplitudes to perform this function can be made small compared to the write currents, $I_w >> I_{rf}$, and the readout is non-destructive.

Related to the modifications of the basic cell discussed above is another modification of the basic cell which further acts to improve device performance. A superconducting ground plane corresponding to ground plane 12B shown in FIG. 3(b) can be fabricated under the cell, which acts to shield the device from the self-field of the current in the superconducting bridge 12A. At the same time, the ground plane 12A magnifies the local, controlling fields associated with current pulses in the write wires, thereby decreasing the required amplitude of write current. A typical ground plane would be formed by a low temperature superconducting film with thickness approximately 200 nm. Superconducting ground planes are standard device components in superconducting devices, and therefore the provision of such a ground plane does not add any significant complications to the fabrication process.

Furthermore, it has been discovered that both the basic device and the modified device are capable of achieving current gain, and may, therefore, find application as a current amplifier. Since there are no viable superconducting device current amplifiers, such an application could be important. No alternation need be made to embodiments already described. However, it should be explicitly noted that the amplitude of current in the write wire of an integrated device may be substantially less than the magnitude of critical current than the device controls. With the use of appropriate circuitry, this observation can be made to equate to a demonstration of current gain. It is believed that current gains as large as ten may be achieved, for currents in the range of 0.1 mA to 100 mA.

Figure 9A:
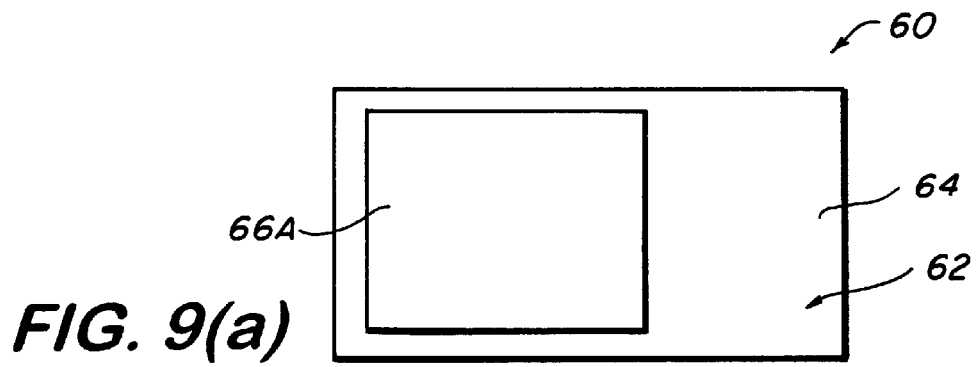
FIGS. 9(a) and 9(b) are a highly schematic top plan view and a side elevational view, respectively, of a further embodiment of the invention, as applied to a hybrid Hall effect device.
Figure 9B:
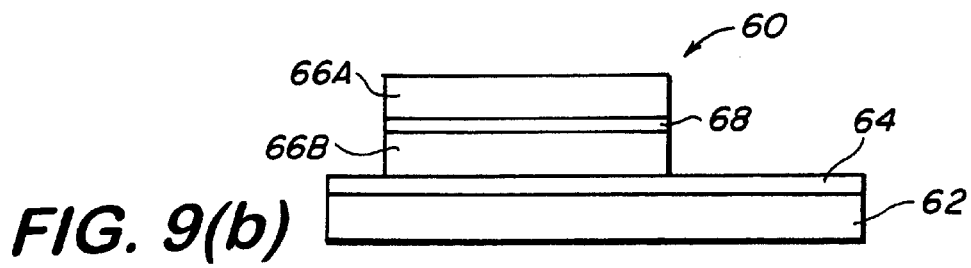

Referring to FIGS. 9(a) and 9(b), as indicated above, in accordance with a further aspect of the invention a bilayer ferromagnetic film corresponding to that described above (e.g., corresponding to that formed by film layers 14A and 14B of FIGS. 2(a) and 2(c) and FIG. 3(b)) can be used to modify a cell or device referred to as a hybrid Hall effect device, generally indicated at 60 in FIGS. 9(a) and 9(b). Such devices are described in detail in U.S. Pat. No. 5,652,445 (Johnson) which is hereby incorporated by reference, and reference is made to that patent for a full description of hybrid Hall effect devices. In general, such devices employ a ferromagnetic layer which can be changed in state by an externally applied field and which thus permits the device to have two stable magnetization states (positive and negative) along an anisotropy axis that can correspond to two different data values (0 or 1). As can be seen in FIG. 9(b), which shows a Hall plate 62 having an electrically isolating or buffer layer 64 thereon, a pair of ferromagnetic layers or films 66A and 66B, separated by insulating layer 68 corresponding, e.g., to layer 26 described above, are disposed on Hall plate 62. The function here of layers 66A, 66B is basically the same as that of the single ferromagnetic layer described in the above-mentioned Johnson patent but because of the two layers, each memory cell can store two bits of information, with each bit corresponding to the orientation of one of the ferromagnetic layers 66A, 66B. Accordingly, the packing density of a memory array using such a cell or device can be doubled. In general, as indicated above, this approach can be generalized to "n" ferromagnetic layers storing "n" bits of data per cell.

As already indicated above, a number of variations, modifications and alternatives may be made in the embodiments described above, all within the scope of the invention. Other significant variations include the fabrication of a pre-existing weak link in the superconducting strip, with the edge of the ferromagnetic layer directly over the weak link. The primary advantage of this modification is that superconductor strips with large values of critical field, such as HTS, will have a reduced value of critical field in a weak link region. The reduced value may be such that the weak link can be switched on and off by the fringe magnetic fields of the ferromagnetic film. Also, niobium and niobium nitride are preferred materials for the LTS device embodiment. These materials are widely used in LTS digital superconducting electronics.

Although the invention has been described above in relation to preferred embodiments thereof, it will be understood by those skilled in the art that variations and modifications can be effected in these preferred embodiments without departing from the scope and spirit of the invention.

What is claimed is:

1. A magnetoquenched superconductor device comprising:
   a substrate;
   a superconductor element disposed on said substrate;
   a first ferromagnetic film disposed on said superconductor element; and
   a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor.

2. The magnetoquenched superconductor device according to claim 1 further comprising an insulating layer on said superconductor element for isolating said first ferromagnetic layer from said superconductor element.

3. The magnetoquenched superconductor device according to claim 2 further comprising a separator layer disposed between said first and second ferromagnetic films.

4. The magnetoquenched superconductor device according to claim 3 wherein said separator layer comprises an insulator.

5. The magnetoquenched superconductor device according to claim 3 wherein said separator layer comprises a nonmagnetic metal.

6. The magnetoquenched superconductor device according to claim 1 wherein said ferromagnetic films have different coercivities.

7. The magnetoquenched superconductor device according to claim 6 wherein said ferromagnetic films have different magnetic moments.

8. The magnetoquenched superconductor device according to claim 1 wherein said ferromagnetic films have different anisotropies and coercivities.

9. The magnetoquenched superconductor device according to claim 1 wherein one of said ferromagnetic films has a coercivity that is substantially higher than that of the other film and has a fixed orientation, and the other film has an orientation which is controlled.

10. The magnetoquenched superconductor device according to claim 1 wherein said superconductor element comprises a superconductor bridge and said superconductor device further comprises a superconductor ground plane.

11. A random access memory circuit comprising:
a plurality of magnetoquenched superconductor devices arranged in an array of rows and columns,
a row of write lines each individually associated with a corresponding row of superconductor devices, and
a column of write lines each individually associated with a corresponding column of super conductor devices;
said superconductor devices each comprising:
a substrate;
a superconductor element disposed on said substrate;
a first ferromagnetic film disposed on said superconductor element; and
a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and
said write lines controlling switching of individual ones of said superconductor devices.

12. The magnetoquenched superconductor device according to claim 11 wherein said superconductor element comprises a superconductor bridge and said superconductor device further comprises a superconductor ground plane.

13. A memory circuit providing nondestructive readout of data stored therein, said memory circuit comprising:
a plurality of magnetoquenched superconductor devices arranged in an array of columns and rows;
a row of bias lines each individually associated with a corresponding row of superconductor devices;
a row of readout lines each individually associated with a corresponding column of superconductor devices;
a plurality of sense amplifiers each connected to one of said readout lines;
first means connected to each of said bias lines and to each of said superconductor devices for establishing a bias threshold for each of said superconductor devices; and
second means connected to each of said sense lines and to each of said superconductor devices for isolating the respective superconductor devices from the corresponding sense line,
said superconductor devices each comprising:
a substrate;
a superconductor element disposed on said substrate;
a first ferromagnetic film disposed on said superconductor element; and
a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and
said bias lines controlling switching of the magnetizations of said superconductor devices and said sense lines sensing switching of the magnetization of said superconductor devices.

14. The memory circuit according to claim 13 wherein said first and second means comprise first and second diodes, respectively, each of said first diodes being connected between an associated bias line and a corresponding superconductor device and each of said second diodes being connected between an associated sense line and a corresponding superconductor device.

15. The memory circuit according to claim 13 wherein said superconductor element comprises a superconductor bridge and said superconductor device further comprises a superconductor ground plane.

16. A random access memory circuit providing nondestructive readout of data stored therein, said circuit comprising:
a plurality of magnetoquenched superconductor devices arranged in a two dimensional array of rows and columns;
a plurality of columns of read/write lines each individually associated with a corresponding column of superconductor devices;
a plurality of rows of read/write lines each individually associated with a corresponding row of superconductor devices;
a sense line connecting all of said superconductor devices in series for receiving a bias current and for enabling readout of the presence of a voltage or lack thereof;
said superconductor devices each comprising:
a substrate;
a superconductor element disposed on said substrate;
a first ferromagnetic film disposed on said superconductor element; and
a second ferromagnetic film disposed on said first ferromagnetic film, said first and second films being magnetically coupled and having magnetizations which are switchable between a parallel relation wherein the films produce additive magnetic fringe fields that form a weak link in a portion of the superconductor element and an antiparallel relation wherein one of the films substantially absorbs the fringe field of the other film and the resultant fringe fields in the vicinity of the superconductor are such that a weak link is not formed in the superconductor; and said read/write lines controlling switching of the magnetizations of said devices and the presence or absence of a said voltage being a function of whether a said weak link has been formed.

17. The random access memory circuit according to claim 16 wherein said superconductor element comprises a superconductor bridge and said superconductor device further comprises a superconductor ground plane.

18. A hybrid Hall effect memory cell comprising:

a Hall plate;

a first ferromagnetic layer disposed on said Hall plate;

a first separating layer for electrically isolating the first ferromagnetic layer from said Hall plate;

at least a second ferromagnetic layer disposed on first ferromagnetic layer; and a second separating layer electrically isolating said first and second ferromagnetic layers, each of said first and second ferromagnetic layers storing a single bit of data such that said memory cell stores at least two bits of data.

* * * * *